(12) United States Patent
Ross et al.

(10) Patent No.: US 11,114,138 B2
(45) Date of Patent: Sep. 7, 2021

(54) DATA STRUCTURES WITH MULTIPLE READ PORTS

(71) Applicant: Groq, Inc., Menlo Park, CA (US)

(72) Inventors: Jonathan Alexander Ross, Palo Alto, CA (US); Gregory M. Thorson, Palo Alto, CA (US)

(73) Assignee: Groq, Inc., Mountain View, CA (US)

( * ) Notice: Subject to any disclaimer, the term of this patent is extended or adjusted under 35 U.S.C. 154(b) by 4 days.

(21) Appl. No.: 16/132,196

(22) Filed: Sep. 14, 2018

(65) Prior Publication Data

US 2019/0206454 A1 Jul. 4, 2019

Related U.S. Application Data

(60) Provisional application No. 62/559,390, filed on Sep. 15, 2017.

(51) Int. Cl.
*G11C 7/10* (2006.01)
*G06F 9/30* (2018.01)
(Continued)

(52) U.S. Cl.
CPC ........ *G11C 7/1075* (2013.01); *G06F 9/30029* (2013.01); *G06F 9/3887* (2013.01); *G11C 7/22* (2013.01)

(58) Field of Classification Search
None
See application file for complete search history.

(56) References Cited

U.S. PATENT DOCUMENTS 5,796,745 A * 8/1998 Adams ................... G11C 29/20
714/30
6,988,181 B2 1/2006 Saulsbury et al.
(Continued)

OTHER PUBLICATIONS

Taiwanese Intellectual Property Office, Office Action, TW Patent Application No. 108109969, dated Feb. 14, 2020, 12 pages (with concise explanation of relevance).
(Continued)

*Primary Examiner* — Sean D Rossiter
*Assistant Examiner* — Stephanie Wu
(74) *Attorney, Agent, or Firm* — Fenwick & West LLP (57) ABSTRACT

A memory structure having $2^m$ read ports allowing for concurrent access to n data entries can be constructed using three memory structures each having $2^{m-1}$ read ports. The three memory structures include two structures providing access to half of the n data entries, and a difference structure providing access to difference data between the halves of the n data entries. Each pair of the $2^m$ ports is connected to a respective port of each of the $2^{m-1}$-port data structures, such that each port of the part can access data entries of a first half of the n data entries either by accessing the structure storing that half directly, or by accessing both the difference structure and the structure containing the second half to reconstruct the data entries of the first half, thus allowing for a pair of ports to concurrently access any of the stored data entries in parallel.

16 Claims, 5 Drawing Sheets

(51) Int. Cl.
*G06F 9/38* (2018.01)
*G11C 7/22* (2006.01)

(56) References Cited

U.S. PATENT DOCUMENTS

| | | | |
|---|---|---|---|
| 7,421,559 B1* | 9/2008 | Yadav | G11C 7/1075 |
| | | | 365/230.05 |
| 9,691,019 B1 | 6/2017 | Gulland et al. | |
| 9,697,463 B2 | 7/2017 | Ross et al. | |
| 9,710,748 B2 | 7/2017 | Ross et al. | |
| 2002/0103961 A1* | 8/2002 | Ayukawa | G06F 12/0215 |
| | | | 711/104 |
| 2004/0215679 A1 | 10/2004 | Beaumont | |
| 2005/0125594 A1* | 6/2005 | Mattausch | G11C 8/12 |
| | | | 711/5 |
| 2006/0161338 A1* | 7/2006 | Sohn | G11C 7/1012 |
| | | | 711/149 |
| 2008/0244135 A1* | 10/2008 | Akesson | G06F 13/1626 |
| | | | 710/241 |
| 2008/0301354 A1* | 12/2008 | Bekooij | G06F 13/1652 |
| | | | 711/100 |
| 2009/0150621 A1* | 6/2009 | Lee | G11C 7/1075 |
| | | | 711/149 |
| 2011/0022791 A1 | 1/2011 | Iyer et al. | |
| 2011/0320698 A1* | 12/2011 | Wang | G06F 13/1663 |
| | | | 711/105 |
| 2012/0127818 A1 | 5/2012 | Levy et al. | |
| 2012/0331197 A1* | 12/2012 | Campbell | G06F 13/1631 |
| | | | 710/117 |
| 2014/0281284 A1 | 9/2014 | Block et al. | |
| 2015/0378639 A1* | 12/2015 | Chien | G06F 15/167 |
| | | | 711/104 |
| 2016/0246506 A1* | 8/2016 | Hebig | G06F 3/0629 |
| 2016/0328158 A1* | 11/2016 | Bromberg | G06F 3/0611 |
| 2018/0267932 A1 | 9/2018 | Zhu et al. | |

OTHER PUBLICATIONS

PCT International Search Report and Written Opinion. PCT Application No. PCT/US2019/022357, dated Nov. 7, 2019, 11 pages.

* cited by examiner

DATA STRUCTURES WITH MULTIPLE READ PORTS

CROSS-REFERENCE TO RELATED APPLICATIONS

This application claims a benefit, and priority, under 35 U.S.C. § 119(e) to U.S. Provisional Patent Application Ser. No. 62/559,390, titled "Data Structures with Multiple Read Ports," filed on Sep. 15, 2017, which is hereby incorporated by reference in its entirety.

BACKGROUND

The present disclosure generally relates to storage of data structures, and specifically relates to storage of data structures having multiple read ports.

Data structures, such as look-up tables, may be used in many applications to perform a function on received input data. For example, an arithmetic logic unit (ALU) may perform an operation on a received input value by looking up the value in a look-up table and returning a corresponding output value.

In some cases, such as in single instruction multiple data (SIMD) applications, it may be desirable to be able to perform the same operation on different sets of input data in parallel. As such, multiple ALUs or other circuits may need to be able to access the data contained within the look up table in parallel.

SUMMARY

A memory structure having multiple read ports may be used to allow for parallel access by multiple ALUs or other processing devices to a common data structure, such as a look-up table. The memory structure may be constructed using a plurality of memory structures having fewer read ports.

A memory structure having $2^m$ read ports allowing for concurrent access to n data entries can be constructed using three memory structures (e.g., sub-structures) each having $2^{m-1}$ read ports. The three memory structures include a first structure providing access to a first half of the n data entries (n/2 entries), a second structure providing access to a second half of the n data entries (n/2 entries), and a difference structure providing access to difference data between the first and second halves of the n data entries (n/2 entries). Each of the $2^m$ ports may be connected to a respective port of each of the $2^{m-1}$-port data structures, such that a port may access data from the first half of the n data entries by accessing the first structure or by accessing both the difference structure and the second structure to reconstruct the data stored by the first structure. Similarly, a port may access data from the second half of the n data entries by accessing the second structure or by accessing both the difference structure and the first structure to reconstruct the data stored by the second structure.

As such, a 2-port memory structure for accessing n data entries can be constructed using three 1-port memory structure, each storing n/2 data entries. Similarly, a $2^m$-port memory structure for accessing n data entries can be constructed using multiple 1-port memory structures, storing a total of $(3/2)^m * n$ entries.

BRIEF DESCRIPTION OF THE DRAWINGS

Figure (FIG. 1 illustrates a block diagram of a processor with a memory structure having multiple read ports, in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

A data structure such as a look-up table may be used by an arithmetic logic unit (ALU) or other circuit to perform an operation on received input data. In many parallel processing applications, such as single instruction multiple data (SIMD) applications, multiple ALUs may need to access the data structure in parallel. As such, it is desirable for the data structure to be implemented on a memory structure (e.g., a random access memory (RAM) or read only memory (ROM)) having multiple read ports. In addition, although the present disclosure refers primarily to ALUs as reading data from the data structure via one or more read ports, in other embodiments, any other type of circuit or consumer may read data from the data structure via one or more read ports.

Figure 1:
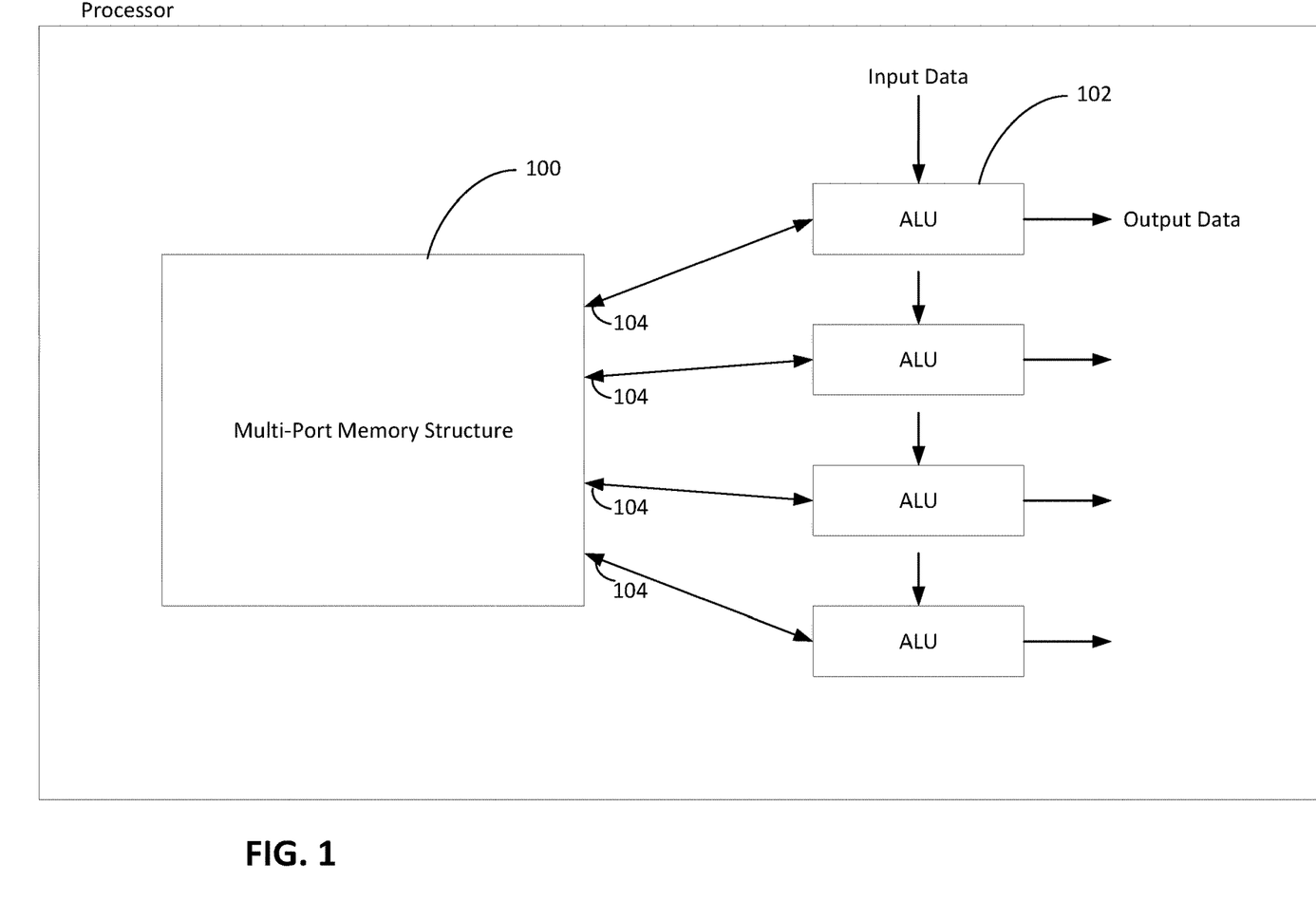

Figure (FIG. 1 illustrates a block diagram of a processor including a memory structure having multiple read ports, in accordance with some embodiments. The processor can be an integrated circuit (IC) device. In some embodiments the processor is a specialized processor for tensor processing. The processor includes a multi-port memory structure 100 and multiple ALUs 102. The multi-port memory structure 100 includes dynamic random access memory (DRAM) cells or other type of memory that store a data structure (e.g., a look-up table) that is accessed by a plurality of the ALUs 102. In some embodiments, the data structure is associated with a function, and maps function input values to function output values. For example, the data structure implements an activation function for a machine learned model, such as a rectified linear unit (RELU) function, binary step function, arc tan function, or other function.

The ALUs 102 may be part of a SIMD or other parallel processor, where each ALU 102 is configured to perform the same arithmetic operation on different sets of input data. For example, each ALU 102 receives a respective set of input data, and performs one or more look-ups on the data structure stored in the memory structure 100 to produce a respective set of output data based upon the function associated with the data structure. In order for the ALUs 102 to operate in parallel, the plurality of ALUs 102 may need to be able to concurrently access the data structure on the memory structure 100. For example, FIG. 1 illustrates the memory structure 100 having four read ports 104, each connected to one of four different ALUs 102. In one embodiment, each read port has its own dedicated address bus and its own dedicated data bus. The ALU reads data via a read port by providing an address to the address bus, and the memory structure 100 returns data from the data structure located at that address. As used herein, "concurrently" may refer to during a common time period (e.g., a clock cycle). For example, each of the plurality of ALUs may transmit a read request to the memory structure 100 during a particular clock cycle, in which the transmitted read requests may be considered to be concurrent to each other.

Figure 2:
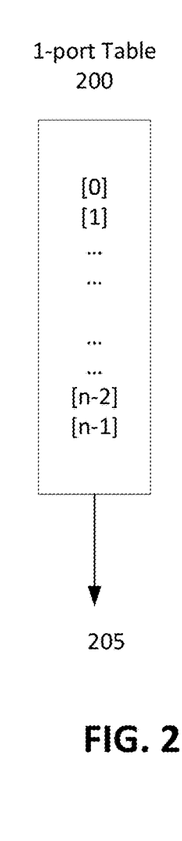
FIG. 2 illustrates a memory structure having a single read port, in accordance with some embodiments.

In some embodiments, a memory structure having multiple read ports, such as the memory structure 100, may be constructed using memory structures having fewer read ports. For example, the memory structure 100 may be constructed from a plurality of memory structures, each having a single read port. FIG. 2 illustrates a memory structure having a single read port, in accordance with some embodiments. The memory structure 200 stores a plurality of data entries (e.g., entries [0] through [n−1], where n comprises an integer value of 2 or greater). Because the memory structure 200 only has a single read port 205, only a single ALU may access the data contained by the memory structure 200 at a time.

An example way to allow for multiple ALUs to access any of the data of the structure 200 in parallel is to duplicate the data (e.g., entries [0] through [n−1]) across multiple single read port memory structures. For example, duplicating the data of the structure 200 across a second single read port memory structure may be done to construct a combined memory structure with two read ports, each of which can be independently accessed by a different ALU, providing access of any of the data in the original structure. However, this configuration also doubles the amount of memory needed to store the data, as each of the entries [0] through [n−1] will be duplicated across both single port memory structures. Using this type of configuration, in order to build a memory structure having n entries accessible over $2^m$ read ports, a total of $n*2^m$ entries will need to be stored, where m comprises a positive integer value.

2-Port Memory Structure

Figure 3:
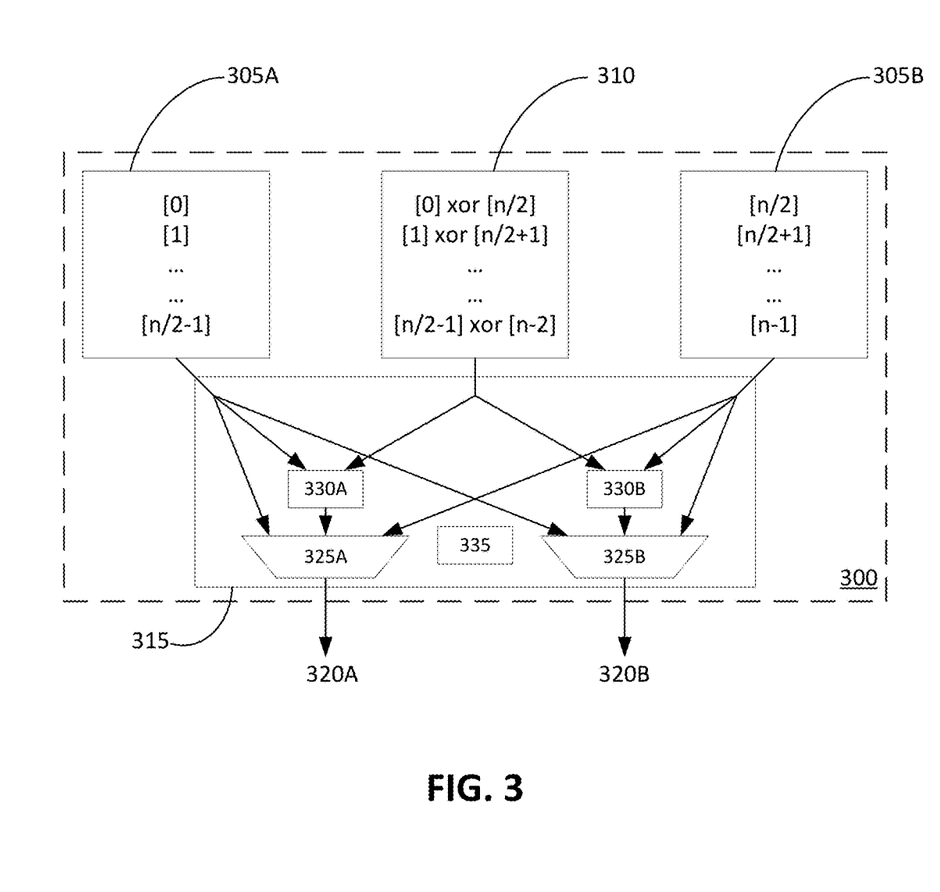
FIG. 3 illustrates a memory structure having two read ports, in accordance with some embodiments.

FIG. 3 illustrates a memory structure having two read ports, in accordance with some embodiments. As illustrated in FIG. 3, a 2-port memory structure 300 allowing for parallel access of any of n entries of data (entries [0] through [n−1]) is built from three 1-port memory structures. Each of the 1-port memory structure contains a table or other data structure storing half of the number data entries of the original data structure (e.g., n/2 entries). As such, the 2-port memory structure 300 will only require storage of 50% more entries in comparison to the original 1-port memory structure (e.g., the 1-port structure 200 illustrated in FIG. 2) while still allowing concurrent access to all n entries through either of the two read ports.

The 2-port memory structure 300 comprises a first 1-port memory structure 305A storing a table containing a first half of the data entries [0] through [n−1], and a second 1-port memory structure 305B storing a table containing a second half of the entries [0] through [n−1]. For ease of explanation, the first half of the data entries may also be referred to as the "lower" half (e.g., entries [0] through [n/2−1]), while the second half may also be referred to as the "upper" half (e.g., entries [n/2] through [n−1]). As such, the first structure 305A may be referred to as the "lower structure", while the second structure 305B may be referred to as the "upper structure."

In addition to the lower and upper structures 305A and 305B, the 2-port structure 300 further comprises a third 1-port structure 310 (hereinafter referred to as the "difference structure") storing n/2 entries, each indicating whether differences exist between a corresponding entry of the lower structure and a corresponding entry of the upper structure. For example, the difference structure may store entries indicating differences between entry [0] of the lower structure and entry [n/2] of the upper structure, between entries [1] and [n/2+1], and so forth. The difference may be determined using any function that allows for the value of a data entry of the lower or upper half to be determined using only the value of the corresponding difference and data entry of the opposite half. For example, in some embodiments, the entries in the difference structure are generated from an exclusive-or (XOR) of corresponding entries of the lower and upper structures. As such, the value of a particular data entry of the lower half can be determined using the corresponding upper half data entry and XOR value, without needing to access the lower structure. In other embodiments, reversible functions other than XOR can be used to calculate the difference entries.

The access circuit 315 comprises a circuit that maps the read ports of the lower structure 305A, upper structure 305B, and difference structure 310 to the two different read ports 320A and 320B (which may be referred to as the lower and upper read ports, respectively). Each of the read ports 320 is configured to receive read requests specifying read addresses of one or more entries to be read. The access circuit 315 comprises, for each of the read ports 320, a multiplexer (MUX) 325 and a difference calculation circuit 330. Each difference calculation circuit 330 is configured to receive data of corresponding entries from the difference structure 310 and one of the lower or upper structures 305A/B, to calculate the value of a corresponding entry from the remaining upper or lower structure 305B/A, such as by implementing an XOR operation or other reversible function. For example, any entry in the upper structure 305B (e.g., entry [n/2]) can be determined from an XOR of the corresponding entries of the lower structure 305A and the difference structure 310 (e.g., entry [0] and entry([0] XOR [n/2])). As such, a particular read port may provide data corresponding to entries of the upper structure 305B, even if the upper structure 305B is unavailable (e.g., due to being accessed by the other read port), by combining data retrieved from the lower structure 305A and the difference structure 310. Similarly, data entries of the lower structure 305A can be determined by accessing the upper structure 305B and the difference structure 310, when the lower structure 305A is unavailable.

In some embodiments, the difference circuits 330 comprise a first difference circuit 330A configured to determine entry values for the upper structure 305B using the lower structure 305A and the difference structure 310, and a second difference circuit 330B configured to determine entry values for the lower structure 305A using the upper structure 305B and the difference structure 310. The first and second difference circuits 330A/B may be referred to as the lower and upper difference circuits respectively.

The MUXes 325 comprise a lower MUX 325A and an upper MUX 325B, each configured to select between the lower structure 305A (for when the read request requests an address from the lower half of the stored entries), the upper structure 305A (for when the read request requests an address from the upper half of the stored entries), and the output of one of the difference circuits 330A or 330B, and provide the selected output to a respective read port 320A/B. For example, the lower read ports 320A receives an output of the lower MUX 325A, which is connected to the difference circuit 330A, while the upper read port 320B receives an output of the upper MUX 325B, which is connected to the difference circuit 330B.

In some embodiments, a conflict control circuit 335 uses a priority scheme to determine how each of the read ports 320A and 320B are able to access the data entries stored by the structures 305A, 305B, and 310. The conflict control circuit 335 is configured to receive addresses from the read ports corresponding to received read requests, and performs conflict resolution between the any concurrently received requests by controlling the MUXes 325A/B to select from which structure each read port 320A/B should receive data from.

For example, as discussed above, the read ports 320 may be designated as a lower read port 320A and an upper read port 320B. The lower read port 320A has "priority" to the lower structure 305A. As such, the conflict control circuit 335 configures the MUX 325A such that all requests through the lower read port 320A for entries in the lower structure 305A are read directly from the lower structure 305A. Similarly, the upper read port 320B has "priority" to the upper structure 305B, such that all requests through the upper read port 320B for entries in the upper structure 305B are read directly from the upper structure 305B. In addition, the conflict control circuit 335 may configure the MUXes 325A/B such that each read port 320A/B may read directly from lower/upper structure 305A/B to which it does not have priority whenever the other read port has not received a concurrent read request to read data from the same structure. However, if both the lower read port 320A and upper read port 320B receive concurrent requests to read one or more entries from the upper structure 305B, then the conflict control circuit 335 configures the MUX 325A such that the lower read port 320A reads from the output of the difference calculation circuit 330A instead, which determines the values of the requested entries of the upper structure 305B using the corresponding entries of the lower structure 305A and the difference structure 310. Similarly, if the lower and upper read ports 320A and 320B receive concurrent requests to read one or more entries from the lower structure 305A, the conflict control circuit 335 configures the MUX 325B to cause the upper read port 320B to read from the output of the difference calculation circuit 330B.

Although FIG. 3 illustrates a particular access circuit configuration, it is understood that in other embodiments, other access circuit configurations may be possible. For example, in some embodiments, either read port 320A or 320B may be able to read data entries of the lower or upper structures using the opposite structure and the difference structure. In some embodiments, an access circuit may be configured to map a plurality of memory structures to more than two ports.

2$^m$-Port Memory Structure

Figure 4:
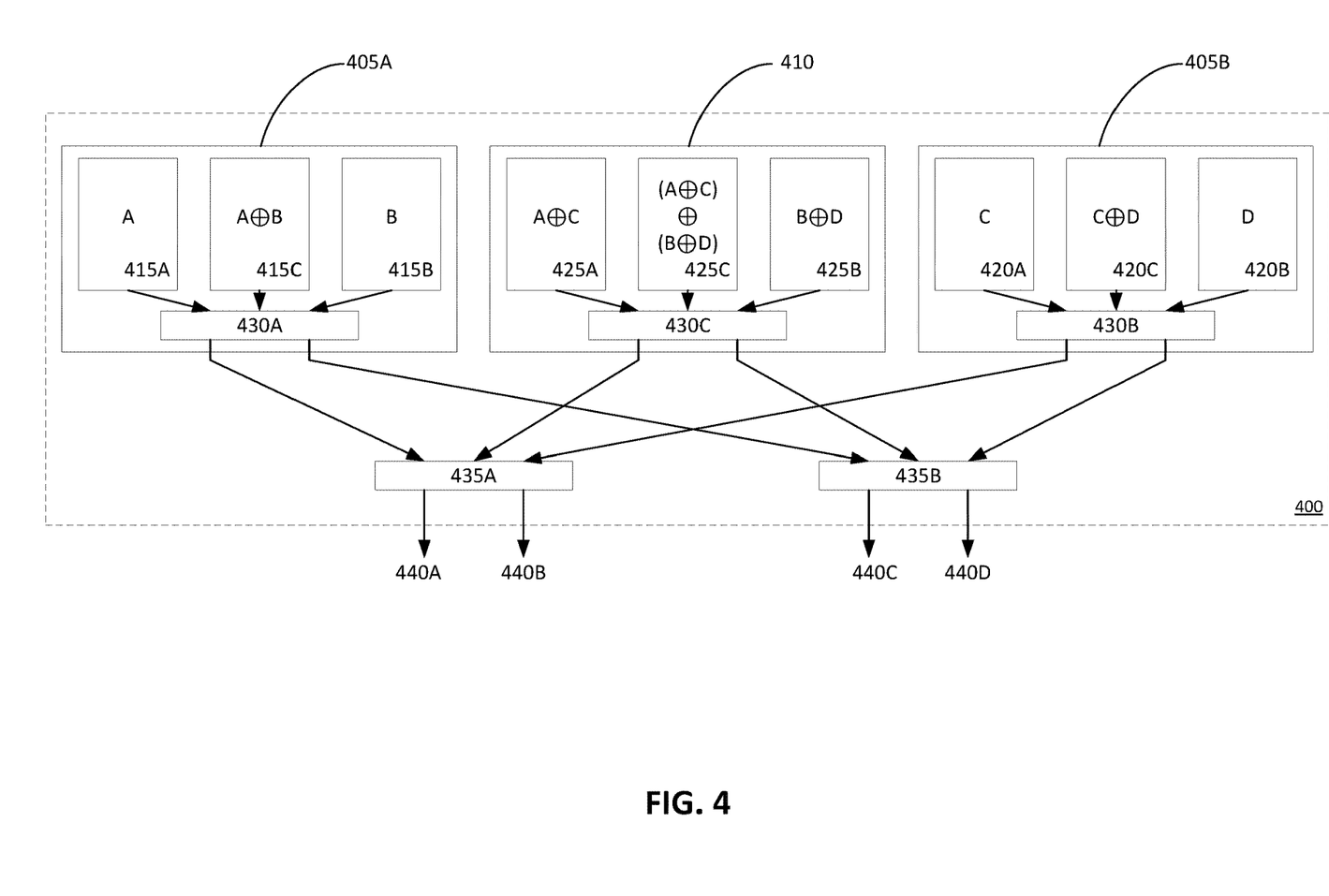
FIG. 4 illustrates a diagram of a 4-port structure that may be assembled using three different 2-port structures, in accordance with some embodiments.

The construction of 2-port memory structures using 1-port memory structures discussed above may be extrapolated to assemble structures with additional numbers of available read ports (e.g., 2$^m$ read ports). FIG. 4 illustrates a diagram of a 4-port memory structure that may be assembled using three different 2-port memory structures, in accordance with some embodiments. The 4-port memory structure 400 is constructed from three 2-port memory structures, including a lower 2-port memory structure 405A, an upper 2-port memory structure 405B, and a difference 2-port memory structure 410. Each of the 2-port memory structures 405A, 405B and 410 may be constructed in a manner similar to the 2-port memory structure 300 illustrated in FIG. 3 (e.g., being constructed from three 1-port memory structures).

For purpose of discussion, the data entries stored by the table implemented on the 4-port memory structure 400 are divided into data subsets "A", "B", "C", and "D", each corresponding to a quarter of the total data entries of the 4-port structure 400.

The first 2-port memory structure 405A comprises three 1-port memory structures comprising a lower structure 415A storing a table containing the data subset "A", an upper structure 415B storing a table containing the data subset "B", and a difference structure 415C storing a table indicating differences between data subsets "A" and "B" (e.g., "A⊕B"). Similarly, the second 2-port memory structure 405B comprises a lower structure 420A storing a table containing the data subset "C", an upper structure 420B storing a table containing the data subset "D", and a difference memory 420C storing a table indicating differences between data subsets "C" and "D" (e.g., "C⊕D"). As such, the first 2-port memory structure 405A and the second 2-port memory structure 405B may function as a 2-port lower structure and a 2-port upper structure for the 4-port memory structure 400. The third 2-port memory structure 410 functions as a 2-port difference structure between the first and second 2-port memory structures 405A and 405B, comprising a lower structure 425A storing a table indicating differences between data subsets "A" and "C" (e.g., "A⊕C"), an upper structure 425B storing a table indicating differences between data subsets "B" and "D" (e.g., "B⊕C"), and a difference structure 425C storing a table indicating differences between all four data subsets (e.g., "(A⊕C)⊕(B⊕D)"). As illustrated in FIG. 4, the differences between data subsets may be determined using an XOR operation.

Each of the 2-port memory structures 405A, 405B, and 410 also comprises a respective access circuit 430, hereinafter referred to as sub-access circuits 430 (e.g., sub-access circuits 430A, 430B, and 430C), which may be substantially similar in structure to the access circuit 315 illustrated in FIG. 3.

Each port of each of the three sub-access circuits 430 connects to an access circuit 435. For example, the first access circuit 435A connects to the lower read port of each sub-access circuit 430, while the second access circuit 435B connects to the upper read port of each sub-access circuit 430. Each access circuit 435A may have a structure substantially similar to the access circuit 315 of FIG. 3. As each access circuit 435 has two read ports, the 4-port memory structure 400 has a total of four read ports 440A, 440B, 440C, and 440D, each able to access any of the data subsets "A", "B", "C", and "D" in parallel.

As illustrated in FIG. 4, the 4-port memory structure 400 for providing access to n data entries can be constructed using nine (or 3$^2$) 1-port memory structures, each storing a table containing n/4 data entries, or as three 2-port memory structures, each storing tables containing a total of (3n/4) data entries. Consequently, the 4-port memory structure 400 stores tables containing a total of 9n/4 data entries. In general, using the above-discussed construction scheme, a memory structure configured to have 2$^m$ ports for providing parallel access to n data entries can be constructed using upper, lower, and difference sub-structures storing a total of $(3/2)^m \cdot n$ entries. In contrast, simply duplicating a 1-port memory structure in order to provide additional ports would require storage of 2$^m \cdot n$ entries for 2$^m$ ports.

Figure 5:
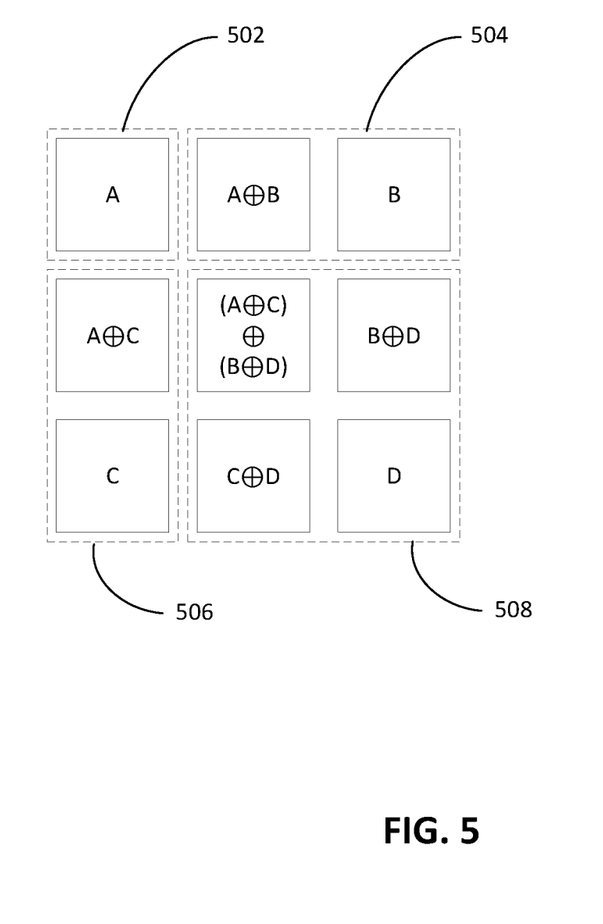
FIG. 5 illustrates a diagram of how the ports of the 4-port structure are able to access any data entry of the structure in parallel.

FIG. 5 illustrates a diagram of how the ports of the 4-port memory structure are able to access any data entry stored by the structure in parallel. As discussed above, the data entries stored by the 4-port memory structure may be divided into four data subset quarters: "A", "B", "C", and "D," each of which may be stored as a table on a single 1-port memory structure. In addition, the 4-port structure contains five additional 1-port structures storing tables indicating differences between one or more pairs of the data subsets (e.g., four structures storing differences between one pair of data subsets, and one structure storing differences of both pairs of data subsets). As such, the 4-port memory structure is assembled using nine 1-port memory structures (e.g., grouped into three 2-port memory structures, as illustrated in FIG. 4).

Using the construction described above, a read port of a 4-port memory structure is able to access a particular data entry (e.g., a data entry of the data subset "A") using one of four different methods, allowing for all four read ports of the memory structure to access the data entry in parallel. Using the first method 502, a read port may access the data subset "A" through the 1-port memory structure storing the table containing the data subset "A" (e.g., structure 415A illustrated in FIG. 4). On the other hand, the remaining methods 504, 506, and 508 require reconstruction of the data subset "A" by accessing a plurality of other memory structures. For example, the read port may use the second method 504 to access the memory structures storing tables containing data subset "B" (structure 415B) and the difference between data subsets "A" and "B" (structure 415C), in order to determine entries of the data subset "A." Alternatively, using the third method 506, the port can access the memory structures storing tables containing the data subset "C" (structure 420A) and the difference between "A" and "C" (structure 425A), to determine entries of the data subset "A." Using the fourth method 508, the port accesses the memory structures storing tables containing the data subset "D" (structure 420B), the difference between "C" and "D" (structure 420C), the difference between "B" and "D" (structure 425B), and the difference between all four data subsets (structure 425C), to determine entries of the data subset "A." Each of the remaining data subsets "B", "C", and "D" can also each be determined using one of four different methods in a similar fashion. Therefore, any data from any of the data subsets can be accessed or determined at each of the four read ports in parallel.

Figure 6:
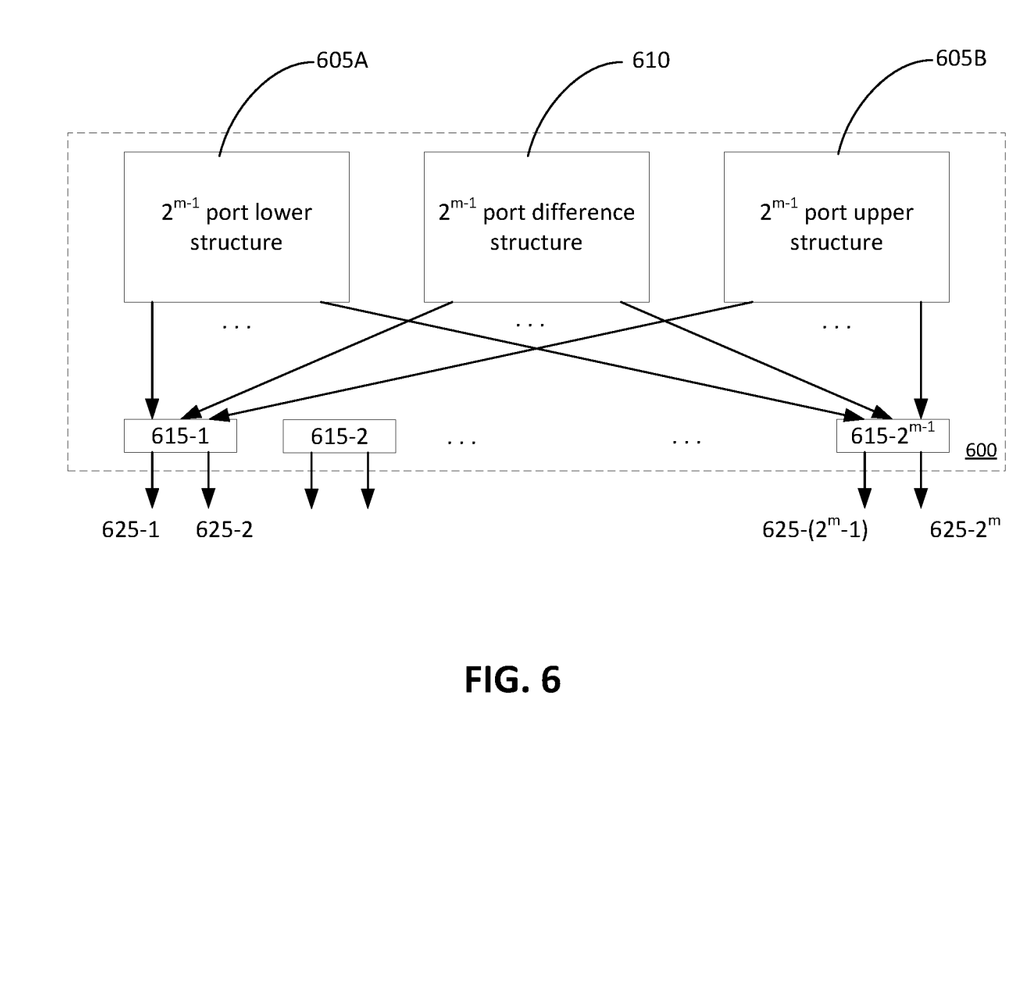
FIG. 6 illustrates a structure having $2^m$ read ports constructed from three $2^{m-1}$-port structures, in accordance with some embodiments.

The techniques and construction described above can be further extrapolated to construct memory structures having $2^m$ read ports. FIG. 6 illustrates a memory structure having $2^m$ read ports constructed from three $2^{m-1}$-port memory structures, in accordance with some embodiments. Each $2^m$-port memory structure for providing access to n data entries is constructed using three $2^{m-1}$-port memory structures, comprising a lower structure 605A, an upper structure 605B, and a difference structure 610. Each of the $2^{m-1}$-port memory structures provides access to n/2 data entries. For example, the lower half of the n data entries are stored in the lower structure 605A, the upper half of the n data entries are stored in the upper structure 605B, and the difference structure 610 stores the differences between corresponding lower half and upper half entries.

Each of the $2^{m-1}$ ports of the $2^{m-1}$-port memory structures maps to an access circuit 615 (e.g., access circuits 615-1 through 615-$2^{m-1}$). For example, a first port of each of the three $2^{m-1}$-port memory structures maps to a first access circuit 615-1, a second port of each of the three $2^{m-1}$-port memory structures maps to a second access circuit 615-2, and so forth up to the access circuit 615-$2^{m-1}$.

Each access circuit 615 contains two read ports 625 (e.g., a lower read port and an upper read port 625-1 and 625-2 ... 625-($2^{m-1}$-1) and 625-$2^{m-1}$), each able to access either the $2^{m-1}$-port lower and upper structures 605A/B directly, or determine the value of data entries of the lower or upper structure using the difference structure 610 and the opposite structure. For example, each access circuit may be configured such that their respective lower read port is always able to access the lower sub-table 605A directly but uses the lower sub-table 605A and the difference sub-table 610 to determine values of entries in the upper sub-table 605B when the respective upper read port needs to concurrently access the upper sub-table 605B. Similarly, the upper read port is always able to access the upper sub-table 605B, but uses the upper sub-table 605B and the difference sub-table 610 to determine values of entries in the lower sub-table 605A when the lower read port is to concurrently access the lower sub-table 605A.

Thus, as illustrated in FIG. 6, the $2^m$-port memory structure will comprise $2^{m-1}$ access circuits mapped to each of the three $2^{m-1}$-port memory structures. As each access circuit 615 contains 2 ports, a total of $2^m$ ports are available. This allows for the $2^m$-port structure to be constructed using $(3/2)^m$*n entries.

Although the techniques described herein primarily discuss constructing memory structures having multiple read ports using 1-port memory structures, it is understood that in other embodiments, memory structures having more than one read port (e.g., 2 read ports, 3 read ports, etc.) may be used to construct memory structures having additional read ports. For example, three memory structures each having k read ports can be used to construct a memory structure having up to 2 k read ports using the configuration described above.

In addition, constructed memory structures are not necessarily limited to $2^m$ ports. For example, if a particular level of the memory structure contains a number of ports that is not a power of two, a subsequent level may also have a number of ports that is not a power of 2 (e.g., three 3-port memory structures can be used to construct a 6-port memory structure). In addition, fewer access circuits may be used at a given level, reducing the total number of available read ports. For example, referring to FIG. 6, less than (m−1) access circuits 615 may be used, such that not every port of each $2^{m-1}$-port sub-structure maps to an access circuit 615, resulting in less than $2^m$ total read ports.

Although the above examples illustrate each level of a multiple read port memory structure constructed using two sub-structures storing subsets of data (e.g., lower and upper halves) and a difference sub-structure, it is understood that in other embodiments, different numbers of sub-structures may be used. For example, in some embodiments, the data entries may be divided between three sub-structures and a difference sub-structure. Instead of the difference corresponding to an XOR operation, a different operation (such as addition mod 3) may be used. In some embodiments, an access circuit may be configured to connect and control access to a plurality of the sub-structures to more than two ports.

Writing Data

A multiple read port memory structure (e.g., the $2^m$-port memory structure 600 described in FIG. 6) constructed from a plurality of component memory structures (e.g., the 1-port memory structure 200 described in FIG. 2) may be considered to comprise a plurality of levels. For example, a $2^m$-port memory structure constructed from a plurality of 1-port memory structures may comprise m levels, each level comprising $3^k$ memory structures each having $2^{m-k}$ read ports, where k indicates a level and corresponds to an integer between 1 and m. For example, referring to the 4-port memory structure 400 illustrated in FIG. 4, the memory structure 400 has a k=1 level containing three 2-port memory structures, and a k=2 level containing 9 1-port memory structures.

When writing data into a $2^m$-port memory structure, a recursive writing process is used such that the data to be written is reflected in all levels of the structure. For example, referring to the configuration illustrated in FIG. 4, in order to write new data into a particular data subset (e.g., data subset "B"), the data needs to be written to the 2-port lower structure 405A and the difference structure 410. Within the 2-port lower structure 405A, the data is written to the upper structure 415B (containing the table storing the data subset "B"). In addition, the data of the difference structure 415C (storing (A⊕B)) is also recalculated. In addition, within the 2-port difference structure 410, data within the upper structure 425B (storing (B⊕D)) and the difference structure 425C (storing (A⊕C)⊕(B⊕D)) also needs to be recalculated.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A memory structure, comprising:
    a first memory sub-structure configured to store a first subset of data;
    a second memory sub-structure configured to store a second subset of data;
    a third memory sub-structure configured to store difference data corresponding to the first subset of data and the second subset of data, and wherein the first, second, and third memory sub-structures each have one read port; and
    at least one access circuit connected to the first, second, and third sub-structures for controlling access to the first, second, and third sub-structures by at least a first mapped read port and a second mapped read port, comprising:
        a first difference calculation circuit connected to the first mapped read port and configured to reconstruct portions of data from the second sub-structure data using corresponding portions of first sub-structure data and third sub-structure data, and
        a second difference calculation circuit connected to the second mapped read port and configured to reconstruct portions of data from the first sub-structure using corresponding portions of second sub-structure data and third sub-structure data;
    wherein the at least one access circuit is configured to:
        in response to both the first and second mapped read ports receiving, during a first time period, read requests to read from the second subset of data stored on the second sub-structure, provide data from the second sub-structure to satisfy the read request from the second mapped read port, and reconstruct, using the first difference circuit connected to the first mapped read port, a portion of the second subset of data from corresponding portions of data stored on the first memory sub-structure and data stored on the third memory sub-structure to concurrently satisfy the read request from the first mapped read port, and
        in response to both the first and second mapped read ports receiving, during a second time period, read requests to read from the first subset of data stored on the first sub-structure, provide requested data from the first sub-structure to satisfy the read request from the first mapped read port, and reconstruct, using the second difference circuit connected to the second mapped read port, a portion of the first subset of data from corresponding portions of the data stored on the second memory sub-structure and data stored on the third memory sub-structure to concurrently satisfy the read request from the second mapped read port.

2. The memory structure of claim 1, wherein the access circuit is configured to allow the first mapped read port to read requested data from the second sub-structure storing the second subset of data in response to no read request to read from the second subset of data being received from the second mapped read port during a same clock cycle, and to allow the second mapped read port to read requested data from the first sub-structure storing the first subset of data in response to no read request to read from the first subset of data being received from the first mapped read port during a same clock cycle.

3. The memory structure of claim 1, wherein the difference data comprises XOR values between corresponding portions of the first subset of data and the second subset of data.

4. The memory structure of claim 1, wherein each of the first, second, and third sub-structures contains $2^{m-1}$ read ports, wherein corresponding read ports of each of the first, second, and third sub-structures are connected to $2^{m-1}$ respective access circuits of the at least one access circuit, where m is a positive integer greater than 1, and wherein the respective access circuits are able read any of the data contained within the first, second, or third sub-structures through their respective $2^{m-1}$ read ports in parallel.

5. The memory structure of claim 4, wherein the at least one access circuit comprises $2^{m-1}$ access circuits, where each access circuit controls access to the first, second, and third sub-structures by at least a respective first mapped read port and second mapped read port.

6. The memory structure of claim 1, wherein the first and second subsets of data are associated with a function, and wherein the first and second read ports are configured to receive the read requests in parallel as part of a single instruction multiple data (SIMD) application.

7. A processor, comprising:
a plurality of arithmetic logic units (ALUs), each configured to implement a mathematical function;
the memory structure of claim 1, wherein the first subset and second subset of data stored by the first and second memory sub-structures represents outputs of the mathematical function for different input values, and the at least the first mapped read port and the second mapped read port are in communication the plurality of ALUs, each ALU implementing the mathematical function by sending, via a corresponding read port of the at least the first mapped read port and the second mapped read port, read requests for portions of the stored data of the memory structure.

8. The processor of claim 7, wherein the plurality of ALUs generate and send read requests to the memory structure in parallel as part of a single instruction multiple data (SIMD) application.

9. A method for reading data from a memory through multiple read ports, comprising:
receiving, at a first arithmetic logic unit (ALU) and a second ALU, input data to be processed by the first and second ALUs;
generating, by the first and second ALUs, respective first and second read requests based upon the received input data for retrieving data from a memory structure, the memory structure comprising at least:
a first sub-structure storing a first subset of data;
a second sub-structure storing a second subset of data;
a third sub-structure storing difference data corresponding to the first subset of data and the second subset of data, and wherein the first, second, and third memory sub-structures each have one read port;
an access circuit connected to the first, second, and third sub-structures for controlling access to the first, second, and third sub-structures by at least a first mapped read port and a second mapped read port, comprising:
a first difference calculation circuit connected to the first mapped read port and configured to reconstruct portions of data from the second sub-structure data using corresponding portions of first sub-structure data and third sub-structure data, and
a second difference calculation circuit connected to the second mapped read port and configured to reconstruct portions of data from the first sub-structure using corresponding portions of second sub-structure data and third sub-structure data;
during a first time period, transmitting the first and second read requests to the access circuit of the memory structure via the first mapped read port and the second mapped read port, respectively;
at the access circuit, in response to a determination that both the first read request and the second read request request data from the second subset of data, providing to the second ALU through the second mapped read port the data requested by the second read request from the second subset of data stored on the second sub-structure, and providing to the first ALU through the first mapped read port data requested by the first read request by using the first difference circuit connected to the first mapped read port to reconstruct a requested portion of the second subset of data using the first subset of data stored on the first sub-structure and the difference data stored on the third sub-structure.

10. The method of claim 9, wherein the difference data comprises XOR values between corresponding portions of the first subset of data and the second subset of data.

11. The memory structure of claim 1, wherein the first time period and the second time period correspond to respective first and second clock cycles.

12. A memory configured to allow for concurrent read requests of a data structure from each of up to 2 m output read ports, where m is an integer greater than 1, comprising:
a plurality of memory structures, each having a respective set of 2m−1 read ports wherein any of the subset of data stored by the respective structure can be read concurrently through the respective 2m−1 read ports of the structure in parallel, wherein the plurality of memory structures comprises a first set of memory structures each storing at least a respective subset of the data structure and a difference memory structure storing difference data corresponding to data of a first structure of the first set of memory structures and a remaining structure of the first set of memory structures; and
a set of up to 2m−1 access circuits, each connected to a respective read port of the 2m−1 read ports of each of the first structure, remaining structure and the difference memory structure and having respective first and second output read ports of the up to 2 m output read ports, and configured to satisfy concurrent read requests for data from the first structure from both the first and second output read ports by passing data from the first structure to the first output read port and concurrently passing data reconstructed data using the difference memory structure and the remaining structure to the second output read port.

13. The memory structure of claim 12, wherein the set of access circuits comprises $2^{m-1}$ access circuits.

14. The memory structure of claim 12, wherein:
each of the plurality of memory sub-structures comprises a plurality of single-port memories connected to the set of access circuits via an access circuit structure, the plurality of single-port memories comprising a first portion of single-port memories storing data of the data structure and a second portion of single port memories storing difference data between at least two single-port memories of the first portion, and
wherein the set of access circuits and the access circuit structure are configured to satisfy concurrent read requests for data from a selected single port memory of the plurality of single-port memories from multiple different output read ports, by passing data from the selected single-port memory to a corresponding output read port of the multiple different output read ports, and reconstructing data of the selected single port memory using a different combination of at least one other single port memories of the first portion and at least one single-port memory of the second portion to satisfy each remaining concurrent read request from the multiple different output read ports.

15. The memory structure of claim 12, wherein each access circuit of the set of access circuits has three input ports coupled to respective read ports of the first structure, difference structure, and remaining structure.

16. The memory structure of claim 12, wherein each access circuit of the set access circuits comprises:
a first difference calculation circuit connected to the first output read port and configured to reconstruct data of the remaining structure using corresponding portions of the first structure and the difference structure, and
a second difference calculation circuit connected to the second output read port and configured to reconstruct data of the first structure using corresponding portions of the remaining structure and the difference structure;
wherein the access circuit is configured to:
in response to both the first and second output read ports receiving, during a first time period, read requests to read from data stored on the remaining structure, provide data from the remaining structure to satisfy the read request from the second output read port, and reconstruct, using the first difference circuit connected to the first output read port, requested data of the remaining structure concurrently satisfy the read request from the first output read port, and
in response to both the first and second output read ports receiving, during a second time period, read requests to read data stored on the first structure, provide requested data from the first structure to satisfy the read request from the first output read port, and reconstruct, using the second difference circuit connected to the second output read port, requested data of the first structure to concurrently satisfy the read request from the second output read port.

* * * * *

UNITED STATES PATENT AND TRADEMARK OFFICE
CERTIFICATE OF CORRECTION

PATENT NO. : 11,114,138 B2
APPLICATION NO. : 16/132196
DATED : September 7, 2021
INVENTOR(S) : Ross et al.

Page 1 of 1

It is certified that error appears in the above-identified patent and that said Letters Patent is hereby corrected as shown below:

In the Claims

In Column 10, in Claim 1, Line 67, delete "sub- structure" and insert -- sub-structure --, therefor.

In Column 11, in Claim 4, Line 24, delete "able" and insert -- able to --, therefor.

In Column 12, in Claim 12, Line 43, delete "2 m" and insert -- $2^m$ --, therefor.

In Column 12, in Claim 12, Line 46, delete "2m-1" and insert -- $2^{m-1}$ --, therefor.

In Column 12, in Claim 12, Line 48, delete "2m-1" and insert -- $2^{m-1}$ --, therefor.

In Column 12, in Claim 12, Line 56, delete "2m-1" and insert -- $2^{m-1}$ --, therefor.

In Column 12, in Claim 12, Line 57, delete "2m-1" and insert -- $2^{m-1}$ --, therefor.

In Column 12, in Claim 12, Line 60, delete "2 m" and insert -- $2^m$ --, therefor.

In Column 12, in Claim 12, Line 65, delete "reconstructed data" and insert -- reconstructed --, therefor.

In Column 13, in Claim 14, Line 4, delete "sub-structures" and insert -- structures --, therefor.

In Column 13, in Claim 14, Line 9, delete "single port" and insert -- single-port --, therefor.

In Column 13, in Claim 14, Line 14, delete "single port" and insert -- single-port --, therefor.

In Column 13, in Claim 14, Line 19, delete "single port" and insert -- single-port --, therefor.

In Column 13, in Claim 14, Line 21, delete "single port" and insert -- single-port --, therefor.

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*